United States Patent
Jang

(10) Patent No.: US 8,222,959 B2
(45) Date of Patent: Jul. 17, 2012

(54) AMPLIFICATION CONTROL CIRCUIT

(75) Inventor: Dae Seok Jang, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 12/957,076

(22) Filed: Nov. 30, 2010

(65) Prior Publication Data

US 2011/0234323 A1    Sep. 29, 2011

(30) Foreign Application Priority Data

Mar. 23, 2010    (KR) .................. 10-2010-0025710

(51) Int. Cl.
    *H03F 3/04*    (2006.01)
(52) U.S. Cl. .................. 330/297; 330/127; 330/296
(58) Field of Classification Search .................. 330/297, 330/127, 296
    See application file for complete search history.

(56) References Cited

U.S. PATENT DOCUMENTS

| 6,081,161 | A * | 6/2000 | Dacus et al. | 330/297 |
| 6,614,309 | B1 * | 9/2003 | Pehlke | 330/296 |
| 7,102,442 | B2 * | 9/2006 | Anderson | 330/285 |
| 7,193,471 | B2 * | 3/2007 | Tsutsui et al. | 330/285 |
| 7,348,853 | B2 * | 3/2008 | Camnitz et al. | 330/297 |
| 7,804,364 | B2 * | 9/2010 | Dupuis et al. | 330/297 |
| 7,839,218 | B2 * | 11/2010 | Shimamoto et al. | 330/298 |

FOREIGN PATENT DOCUMENTS

| KR | 20000002839 | 1/2000 |
| KR | 1020070050917 A | 5/2007 |
| WO | 9967888 | 12/1999 |

OTHER PUBLICATIONS

Korean Office Action for Application No. 10-2010-0025710 mailed May 18, 2011.

* cited by examiner

*Primary Examiner* — Patricia Nguyen
(74) *Attorney, Agent, or Firm* — Lowe, Hauptman, Ham & Berner, LLP

(57) ABSTRACT

There is provided an amplification control circuit that can adjust the amount of current being supplied to an amplifier according to a reference signal set beforehand. An amplification control circuit according to an aspect of the invention may include: a power supply section supplying a DC power set beforehand to at least one amplifier according to a reference signal set beforehand; a current control section detecting a current being supplied from the power supply section according to a ratio set beforehand and controlling the amount of current being supplied to the at least one amplifier from the power supply section; and a current adjustment section adjusting a level of the current being controlled by the current control section in order to increase or decrease the amount of current being supplied to the at least one amplifier from the power supply section.

9 Claims, 1 Drawing Sheet

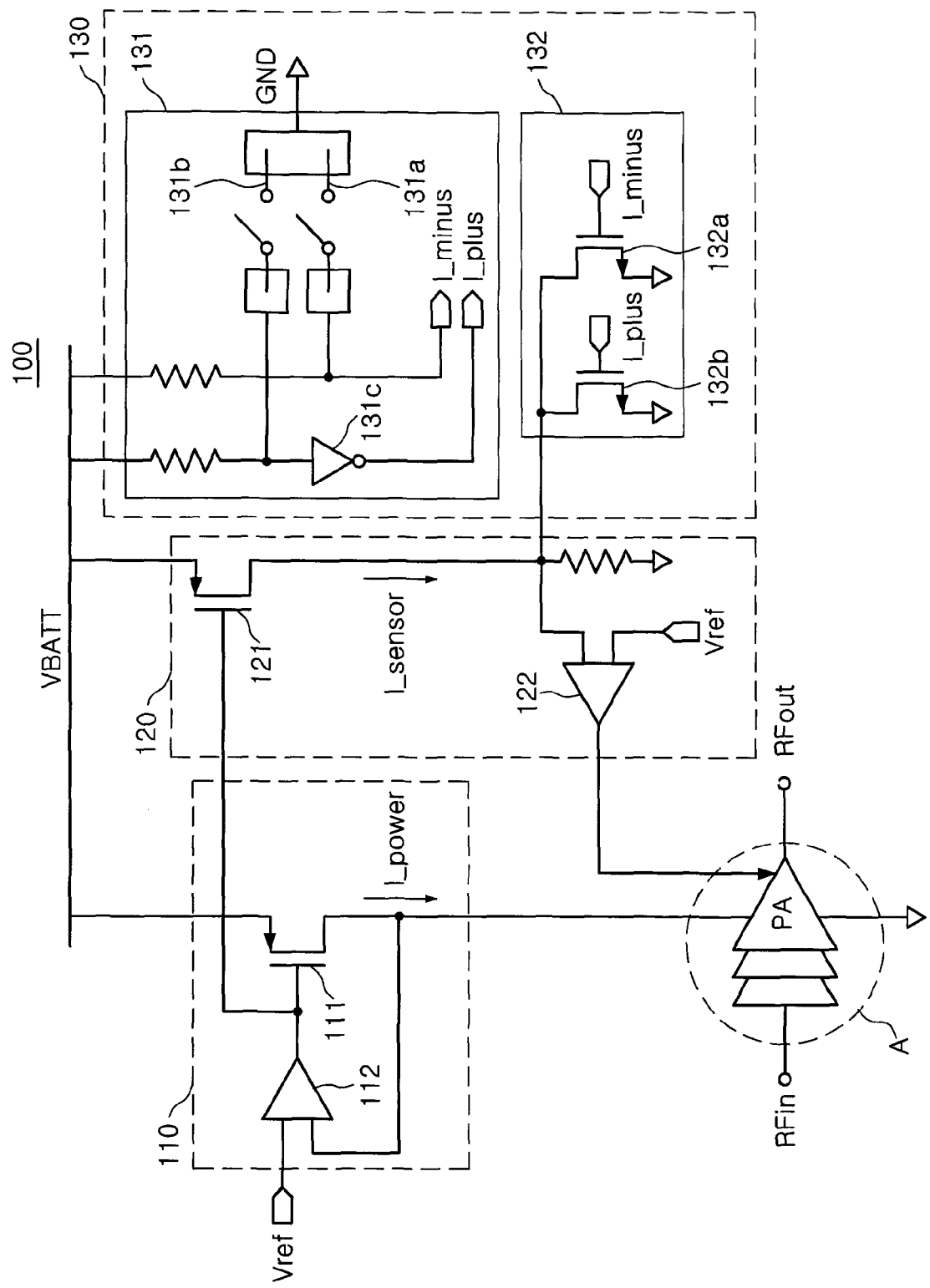

AMPLIFICATION CONTROL CIRCUIT

CROSS-REFERENCE TO RELATED APPLICATIONS

This application claims the priority of Korean Patent Application No. 10-2010-0025710 filed on Mar. 23, 2010 in the Korean Intellectual Property Office, the disclosure of which is incorporated herein by reference.

BACKGROUND OF THE INVENTION

1. Field of the Invention

The present invention relates to an amplification control circuit, and more particularly, to an amplification control circuit that can adjust the amount of current being supplied to an amplifier.

2. Description of the Related Art

Mobile communications terminals have come into widespread use because of their ease of use. As the use of these mobile communications terminals has increased, it has become important to run various kinds of applications to meet consumer demand and allow for extended use at the same time.

In order to extend the use time of a mobile communications terminal, it is important to increase battery capacity. However, the size of batteries is limited since small, lightweight, and thin mobile communications terminals are in demand in the market. Therefore, there is a need to increase the power efficiency of the main elements inside a mobile communications terminal.

In order to transmit and receive RF signals, this mobile communications terminal uses a power amplifier. This power amplifier takes up a considerable portion of the overall power consumption of the mobile communications terminal. Thus, there is a need for an increase in the power efficiency of the power amplifier.

While this power amplifier is produced during a semiconductor process, the power amplifier may encounter errors during the process and end up consuming more currents than is strictly necessary.

SUMMARY OF THE INVENTION

An aspect of the present invention provides an amplification control circuit that can adjust the amount of current being supplied to an amplifier.

According to an aspect of the present invention, there is provided an amplification control circuit including: a power supply section supplying a DC power set beforehand to at least one amplifier according to a reference signal set beforehand; a current control section detecting a current being supplied from the power supply section according to a ratio set beforehand and controlling the amount of current being supplied to the at least one amplifier from the power supply section; and a current adjustment section adjusting a level of the current being controlled by the current control section in order to increase or decrease the amount of current being supplied to the at least one amplifier from the power supply section.

The power supply section may include: a power conversion unit converting input power into the DC power and supplying the DC power to the at least one amplifier; and a first comparator comparing the reference signal having a voltage value set beforehand with a feedback signal, in which a voltage being supplied to the at least one amplifier from the power conversion unit is fed back, in order to control the conversion of the input power into the DC power.

The current control section may include: a detection unit receiving a control signal being supplied to the power conversion unit from the first comparator according to the ratio to detect the current being supplied by the power conversion unit; and a second comparator comparing a detection value of the detection unit with the voltage value of the reference signal and supplying a control signal corresponding to a result of the comparison to the at least one amplifier.

The current adjustment section may include: a control unit supplying or cutting off the DC power to transmit a control signal; and a selection unit connected in series with the detection unit and adding or subtracting an additional current to or from a current being transmitted to the second comparator according to the control signal from the controller.

The control unit may include: a first selector supplying or cutting off the DC power to transmit a current subtraction adjustment signal to the selection unit; a second selector controlling supply and cutoff of the DC power; and an inverter inverting a signal from the second selector to transmit a current addition adjustment signal to the selection unit.

The selection unit may include: a first switch performing a switching operation according to the current subtraction adjustment signal from the first selector to add the additional current to the current being transmitted to the second comparator; and a second switch performing a switching operation according to the current addition adjustment signal from the inverter to subtract the additional current from the current being transmitted to the second comparator.

Each of the first and second selectors may be formed of bonding wires.

BRIEF DESCRIPTION OF THE DRAWINGS

The above and other aspects, features and other advantages of the present invention will be more clearly understood from the following detailed description taken in conjunction with the accompanying drawings, in which:

FIG. 1 is a schematic view illustrating the configuration according to an exemplary embodiment of the present invention.

DETAILED DESCRIPTION OF THE PREFERRED EMBODIMENT

Exemplary embodiments of the present invention will now be described in detail with reference to the accompanying drawings.

FIG. 1 is a schematic view illustrating the configuration of an amplification control circuit according to an exemplary embodiment of the invention.

Referring to FIG. 1, an amplification control circuit 100 according to this embodiment may include a power supply section 110, a current control section 120, and a current adjustment section 130.

The power supply section 110 may include a power conversion unit 111 and a first comparator 112.

The power conversion unit 111 may supply a current I_power and a voltage set beforehand to an amplifier A, which amplifies an input signal RFin to output an output signal RFout.

The voltage and current being supplied by the power conversion unit 111 may be controlled by the first comparator 112.

The first comparator 112 compares a feedback signal in which the voltage, supplied by the power conversion unit 111 to the amplifier A, is fed back, with a reference signal Vref having a predetermined voltage value. According to a result of the comparison, a voltage level of DC power being supplied from the power conversion unit 111 to the amplifier A may be controlled.

The current control section 120 may include a detection unit 121 and a second comparator 122.

The detection unit 121 may detect the current being supplied to the amplifier A according to a control signal of the first comparator 112. Here, the amount of current being detected by the detection unit 121 and being transmitted thereto may have a predetermined ratio relative to the amount of current being supplied by the power conversion unit 111.

The power conversion unit 111 and the detection unit 121 may be formed of integrated circuits by a semiconductor process, so that each of the power conversion unit 111 and the detection unit 121 may be formed of a p-type metal-oxide-semiconductor field-effect transistor (MOS FET). The above-described predetermined ratio is determined by the widths of respective gates of the power conversion unit 111 and the detection unit 121. For example, when the gate of the power conversion unit 111 has a width of 100, and the gate of the detection unit 121 has a width of 1, a ratio of 100:1 is determined. When a current of 1 A flows through the power conversion unit 111, a current of 10 mA may flow through the detection unit 121.

The second comparator 122 compares the reference signal Vref with a voltage being applied to a resistor by a current I_sensor flowing according to the detection unit 121, and transmits a control signal according to a result of the comparison to the amplifier A, thereby controlling the amount of current being supplied to the amplifier A from the power conversion unit 111. More specifically, the amount of current within a predetermined range being supplied to the amplifier A from the power conversion unit 111 may be controlled. Though not shown, the amplifier A generally includes a bias circuit and an amplifier core, and the bias circuit controls the amount of current being supplied to transmit the current having the controlled amount to the amplifier core. The second comparator 122 supplies the control signal to the bias circuit, increases the amount of current being supplied to the amplifier core when a voltage level of the control signal is higher than that of a predetermined voltage, and decreases the amount of current being supplied to the amplifier core when the voltage level of the control signal is lower than that of the predetermined voltage. That is, the amount of current being supplied from the power conversion unit 111 to the amplifier A may be adjusted according to the control signal of the second comparator 122.

An amplification control circuit is manufactured by a semiconductor process and may cause a lower current level than a reference level due to errors during the process. Therefore, the gain of the amplifier A may be either low or high. Thus, the current level needs to be adjusted.

The current adjustment section 130 may include a control unit 131 and a selection unit 132.

The control unit 131 may include first and second selectors 131a and 131b and an inverter 131c.

The first and second selectors 131a and 131b may select a transmission path of DC power VBATT. Thus, the first selector 131a may connect or disconnect a transmission path between the DC power VBATT and the ground to thereby supply a current subtraction control signal I_minus. Also, the second selector 131b may connect or disconnect the transmission path between the DC power VBATT and the ground.

The inverter 131c may invert power selected by the second selector 131b to supply a current addition control signal I_plus.

The first and second selectors may be configured to have bonding wires, thereby facilitating the manufacturing process and the configuration thereof.

The selection unit 132 may include first and second switches 132a and 132b.

The first and second switches 132a and 132b may be connected in parallel with each other and may be further connected in parallel with resistors. Each of the first and second switches 132a and 132b may be connected in series between the detection unit 121 and the ground.

Current adjustment using the above-described current adjustment section 130 will now be described in detail.

First, in default status, the first selector 131a and the second selector 131b are disconnected and are electrically insulated from the ground. Thus, the first switch 132a is switched on because a current subtraction control signal I_minus is a high-level signal, while the second switch 132b is switched off because the current addition control signal I_plus is a low-level signal.

Here, when a level of the current I_power, being supplied to the amplifier A from the power supply section 110 according to the control signal of the current control section 120, is higher than a reference level, the level of the current I_power needs to be lowered (an external measurement apparatus may compare the level of the current I_power with the reference level), the first selector 131a is connected so that the current subtraction control signal I_minus is set to be a low-level signal, and the second selector 131b remains disconnected.

Therefore, the first switch 132a is switched off according to the current subtraction control signal I_minus, which is the low-level signal, thereby increasing the amount of the current I_sensor flowing through the second comparator 122. As a result, a value of the voltage being applied to the resistor, formed at an input terminal of the second comparator 122, is increased, and the second comparator 122 can lower the voltage level of the control signal since a value of the voltage being input becomes higher than a reference voltage Vref, thereby reducing the amount of the current I_power of the DC power being supplied to the amplifier A according to the voltage level of the control signal.

On the other hand, when the level of the current I_power being supplied to the amplifier A from the power supply section 110 according to the control signal of the current control section 120 is lower than the reference level, the level of the current I_power needs to be increased. Thus, the second selector 131b is thereby connected, and the first selector 131a is disconnected. Therefore, the second switch 132b is switched on according to the current addition control signal I_plus, which is a high-level signal, so that the current flows through the second switch 132b, and the amount of the current I_sensor flowing through the second comparator 122 is reduced. As a result, the value of the voltage being applied to the resistor formed at the input terminal of the second comparator 122 is reduced, and the second comparator 122 increases the voltage level of the control signal because the value of the voltage being input becomes smaller than that of the reference voltage Vref, thereby increasing the amount of current I_power of the DC power being supplied to the amplifier A.

As described above, according to exemplary embodiments of the invention, when individual current levels of a plurality of amplifiers being manufactured on a production line are either lower or higher than a reference level, the amount of current being supplied to the amplifiers can be adjusted by selectively connecting or disconnecting bonding wires to thereby facilitate current control and readily improve the performance of output power by appropriately supplying currents being consumed by the amplifiers.

As set forth above, according to exemplary embodiments of the invention, current control is facilitated by adjusting the amount of current being supplied to an amplifier by selectively connecting bonding wires, and the performance of output power can be improved by appropriately supplying current being consumed by the amplifier.

While the present invention has been shown and described in connection with the exemplary embodiments, it will be apparent to those skilled in the art that modifications and variations can be made without departing from the spirit and scope of the invention as defined by the appended claims.

What is claimed is:

1. An amplification control circuit, comprising:
a power supply section configured to supply a DC power set beforehand to at least one amplifier according to a reference signal set beforehand;
a current control section configured to detect a current being supplied from the power supply section according to a ratio set beforehand and control an amount of current being supplied to the at least one amplifier from the power supply section; and
a current adjustment section configured to adjust a level of the current being controlled by the current control section in order to increase or decrease the amount of current being supplied to the at least one amplifier from the power supply section.

2. The amplification control circuit of claim 1, wherein the power supply section comprises:
a power conversion unit configured to convert an input power into the DC power and supplying the DC power to the at least one amplifier; and
a first comparator configured to compare the reference signal having a voltage value set beforehand with a feedback signal, in which a voltage being supplied to the at least one amplifier from the power conversion unit is fed back, in order to control the conversion of the input power into the DC power.

3. The amplification control circuit of claim 2, wherein the current control section comprises:
a detection unit configured to receive a control signal being supplied to the power conversion unit from the first comparator according to the ratio to detect the current being supplied by the power conversion unit; and
a second comparator configured to compare a detection value of the detection unit with the voltage value of the reference signal and supply a control signal corresponding to a result of the comparison to the at least one amplifier.

4. The amplification control circuit of claim 3, wherein the current adjustment section comprises:
a control unit configured to supply or cut off the DC power to transmit a control signal; and
a selection unit connected in series with the detection unit for adding or subtracting an additional current to or from a current being transmitted to the second comparator according to the control signal from the controller.

5. The amplification control circuit of claim 4, wherein the control unit comprises:
a first selector configured to supply or cut off the DC power to transmit a current subtraction adjustment signal to the selection unit;
a second selector configured to control supplying or cutting off the DC power; and
an inverter configured to invert a signal from the second selector to transmit a current addition adjustment signal to the selection unit.

6. The amplification control circuit of claim 5, wherein the selection unit comprises:
a first switch configured to perform a switching operation according to the current subtraction adjustment signal from the first selector to add the additional current to the current being transmitted to the second comparator; and
a second switch configured to perform a switching operation according to the current addition adjustment signal from the inverter to subtract the additional current from the current being transmitted to the second comparator.

7. The amplification control circuit of claim 5, wherein each of the first and second selectors is formed of bonding wires.

8. The amplification control circuit of claim 1, wherein the current control section is configured to, based on the detected current, supply a control signal to the at least one amplifier to control the amount of current being supplied to the at least one amplifier from the power supply section.

9. The amplification control circuit of claim 8, wherein the current adjustment section is configured to adjust the control signal supplied from the current control section to the at least one amplifier, to thereby increase or decrease the amount of current being supplied to the at least one amplifier from the power supply section.

* * * * *